US011243684B2

(12) United States Patent
Lang

(10) Patent No.: US 11,243,684 B2
(45) Date of Patent: Feb. 8, 2022

(54) MEASUREMENT APPARATUS AND METHOD FOR ANALYZING A MEASUREMENT SIGNAL

(71) Applicant: Rohde & Schwarz GmbH & Co. KG, Munich (DE)

(72) Inventor: Florian Lang, Gilching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/716,902

(22) Filed: Dec. 17, 2019

(65) Prior Publication Data
US 2020/0225840 A1 Jul. 16, 2020

(30) Foreign Application Priority Data
Jan. 15, 2019 (EP) ..................................... 19151816

(51) Int. Cl.
G06F 3/0484 (2013.01)
G06F 3/0488 (2013.01)
G06F 3/0482 (2013.01)

(52) U.S. Cl.
CPC ........ G06F 3/04883 (2013.01); G06F 3/0482 (2013.01); G06F 3/04847 (2013.01); G06F 2203/04808 (2013.01)

(58) Field of Classification Search
None
See application file for complete search history.

(56) References Cited

U.S. PATENT DOCUMENTS

| 8,907,910 | B2 | 12/2014 | Stearns et al. | |
| 9,965,174 | B2 | 5/2018 | Herbordt et al. | |
| 10,650,840 | B1* | 5/2020 | Solbach | H04S 1/00 |
| 2011/0260962 | A1 | 10/2011 | Benko et al. | |
| 2012/0134641 | A1* | 5/2012 | Kanbe | H04N 21/47217 386/230 |
| 2013/0328787 | A1 | 12/2013 | Stearns et al. | |
| 2014/0108993 | A1* | 4/2014 | Zhai | G06F 3/04886 715/773 |
| 2014/0125600 | A1 | 5/2014 | Meng et al. | |

(Continued)

FOREIGN PATENT DOCUMENTS

| CN | 103592486 A | 2/2014 |
| WO | 2014/166518 A1 | 10/2014 |

OTHER PUBLICATIONS

Extended European search report for European Patent Application No. 19151816.6, dated Aug. 5, 2019, search completed Jul. 23, 2019, 8 pages.

Primary Examiner — Di Xiao
(74) Attorney, Agent, or Firm — Westman, Champlin & Koehler, P.A.

(57) ABSTRACT

The present invention relates to an enhanced control of a measurement device displaying a signal waveform of a measurement signal. For this purpose, the waveform of the measurement signal is displayed on a touch-screen. The touch-screen receives multi-digit touch gestures comprising at least two touch gestures. The touch gestures of the multi-digit touch gesture are analyzed in order to determine simultaneously an operation and a range of the measurement signal on which the determined operation has to be applied. In this way, the control of the measurement device can be simplified.

13 Claims, 3 Drawing Sheets

(56) References Cited

U.S. PATENT DOCUMENTS

| | | | |
|---|---|---|---|
| 2016/0070461 A1* | 3/2016 | Herbordt | G06F 3/04883 345/178 |
| 2016/0077725 A1* | 3/2016 | Maeda | G06F 3/04847 715/833 |
| 2018/0226150 A1* | 8/2018 | Hayter | G16H 20/17 |
| 2019/0022314 A1* | 1/2019 | Schmidt | A61B 5/14532 |

* cited by examiner

MEASUREMENT APPARATUS AND METHOD FOR ANALYZING A MEASUREMENT SIGNAL

CROSS-REFERENCE TO RELATED APPLICATION

This application claims priority to European Patent Application No. 19151816.6, filed on Jan. 15, 2019, the content of which is hereby incorporated by reference.

TECHNICAL FIELD

The present invention relates to a measurement apparatus. The present invention further relates to a method for analyzing a measurement signal.

BACKGROUND

Although applicable in principle to any measurement apparatus providing a signal waveform of a measurement signal, the present invention and its underlying problem will be hereinafter described in combination with a digital oscilloscope.

Measurement devices, for example oscilloscopes or the like, may have a control panel with multiple control elements for configuring the measurement device. With the introduction of touch displays, conventional control panels of a measurement device may be substituted, at least in part, by customized soft controls of touch-screen display. For example, a control panel may be displayed on the touch-screen, wherein the content of the control panel may be dynamically adapted. In this way, a hierarchical menu structure may be realized, wherein multiple hierarchical levels may be displayed subsequently on the same touch-screen display.

For example, an oscilloscope may display a signal waveform, and a user may enter further parameters for setting the oscilloscope or for analyzing the measurement result provided by the oscilloscope. For instance, the user may intend to zoom the display signal waveform, or determine a characteristic parameter, e.g. a maximum or minimum value.

Thus, the user has to go through multiple menus for specifying a desired operation and entering the required parameters. As a consequence, configuring and operating measurement instruments such as an oscilloscope may become a complex and time-consuming operation.

Against this background, a problem addressed by the present invention is to provide an improved measurement apparatus for analyzing a measurement signal, which can be configured and operated in a quick and easy manner. In particular, the present invention aims to provide an improved setting and configuration of a measurement apparatus, which displays a signal waveform of a measured signal.

SUMMARY

The present invention solves this problem with a measurement apparatus and a method for analyzing a measurement signal with the features of the independent claims. Further advantageous embodiments are subject-matter of the dependent claims.

According to a first aspect, a measurement apparatus for analyzing a measurement signal is provided. The measurement apparatus comprises an input port, a touch-screen and a measurement signal processing device. The input port is adapted to receive a measurement signal. The touch-screen is adapted to display a waveform of the received measurement signal. The touch-screen is further adapted to receive a multi-digit touch gesture. The multi-digit touch gesture may comprise at least a first touch gesture and a second touch gesture. The measurement signal processing device is adapted to determine an operation and a range of the measurement signal based on the received multi-digit touch gesture. The measurement signal processing device is further adapted to perform a processing of the measurement signal based on the determined operation and the determined range.

According to a further aspect, a method for analyzing a measurement signal is provided. The method comprises a step of receiving a measurement signal and a step of displaying a waveform of the received measurement signal on a touch-screen. The method further comprises a step of receiving a multi-digit touch gesture. The multi-digit touch gesture may comprise at least a first touch gesture and a second touch gesture. Further, the method comprises a step of determining an operation and a range of the measurement signal based on a received multi-digit touch gesture. The method further comprises a step of processing the measurement signal based on the determined operation and the determined range.

The present invention is based on the fact that configuring and operating a measurement device, in particular a measurement device dealing with presentations of a signal waveform, may become a difficult and time-consuming process. In particular, multiple parameters, for example a range of the signal waveform and a desired operation, which has to be applied to this range, have to be specified. Such a specification may require going through multiple sub-menus.

Thus, it is an idea of the present invention to take into account this finding and to provide a measurement apparatus dealing with signal waveforms, which can be configured and operated in a more convenient and fast manner. For this purpose, a signal waveform of a measurement signal is provided to a user on a touch display, and the further operation of the measurement apparatus is controlled by receiving and analyzing multi-digit touch gestures. Multi-digit touch gestures received on the touch-screen may be used for determining both, a desired range of the measurement signal and a desired operation, which has to be applied to the related range. In particular, the range and the desired operation are determined simultaneously based on a same multi-digit touch gesture.

The input port of the measurement apparatus may receive any kind of measurement signal. For example, the input port may receive an analogue signal. The analogue signal may be provided to an analogue to digital converter, which converts the analogue measurement signal to digital measurement data. The input port may comprise any appropriate further components, such as an amplifier, an attenuator, filter elements or the like. Furthermore, the input port may also receive digital data related to a measurement signal. The measurement signal may be received, for example, by a measurement probe or the like. For this purpose, the source of the measurement signal, in particular the probe, may be connected to the input port by an appropriate connection such as a measurement cable or the like.

The received measurement signal may be processed, for example by the measurement signal processing device or another appropriate processing device. For example, the received measurement signal may be processed in a digital domain by sampling and storing digital data related to the measurement signal. Furthermore, a waveform of the received measurement signal may be displayed on a display such as the touch-screen of the measurement apparatus. In this way, the waveform of the received measurement signal is provided to a user. Accordingly, the user may enter instructions for a further analysis of the measurement signal. For this purpose, the user may enter a multi-digit touch gesture on the touch-screen. The multi-digit touch gesture of the user may be received by the touch-screen for a further analysis. In particular, the multi-digit touch gesture may comprise at least two touch gestures, namely a first touch gesture and a second touch gesture. In other words, the multi-digit touch gesture comprises at least two individual touch gestures, which may be associated with each other.

The received multi-digit touch gesture will be provided from the touch-screen to the measurement signal processing device. Accordingly, the measurement signal processing device may analyze the touch gestures of the multi-digit touch gesture in order to determine parameters for a further processing of the received measurement signal. In particular, the measurement signal processing device may use the touch gestures of the multi-digit touch gesture for determining at least a range of the measurement signal and an operation, which has to be applied to the measurement signal at the determined range. Thus, at least an operation and a range of the measurement signal are determined based on the touch gestures of the multi-digit touch gesture. By determining all these parameters, a further operation of the measurement apparatus for analyzing the measurement signal can be specified only by the received multi-digit touch gesture. Thus, there is no need for a complex navigation through multiple menus, in particular through a multi-hierarchical menu structure. In this way, the operation of the measurement apparatus can be simplified.

The measurement signal processing device may comprise, for example, a general purpose processor with corresponding instructions. The measurement signal processing device may comprise interfacing elements that are coupled to the processor, receive the measurement signal from the input port and provide the received signals to the processor. The interfacing elements may comprise, for example, an analogue to digital converter for converting the received signals into digital data that may be processed by the processor.

The measurement signal processing device may comprise hardware elements, like a processing unit. However, the measurement signal processing device may also be software-implemented at least in part. Instructions may therefore be stored in a memory that is coupled to a general purpose processor, for example via a memory bus. The processor may further execute an operating system that loads and executes the instructions. The processor may be, for example, an Intel processor that runs a Windows or Linux operating system that loads and executes the instructions. Alternatively, the processor may be a processor of an embedded operating system that loads and executes the first instructions.

Further embodiments of the present invention are subject of the further sub-claims and of the following description, referring to the drawings.

In a possible embodiment, the touch-screen may be adapted to receive the first touch gesture and the second touch gesture simultaneously.

By simultaneously receiving the touch gestures of the multi-digit touch gesture, it is possible for a user to enter the desired information on the touch-screen at a single operation. For example, the multiple touch gestures of the multi-digit touch gesture may be entered by separate fingers of a single hand, or by fingers of two separate hands.

In a possible embodiment, the touch-screen may be configured to receive the first touch gesture and the second touch gesture subsequently.

By subsequently entering multiple touch gestures and combining the subsequently received touch gestures to a multi-digit touch gesture, it is possible to enter multiple touch gestures, for example, by only a single finger. Furthermore, by subsequently entering the individual touch gestures, the user may concentrate on the individual touch gestures, respectively. In this way, the individual touch gestures may be entered more precisely.

In a possible embodiment, the measurement signal processing device is adapted to determine whether the determined range relates either to an x-axis or to a y-axis.

For example, the determination on whether the touch gesture relates to an x-axis or a y-axis may be determined depending on a direction of movement when entering the touch gestures. For example, the touch gesture may relate to an x-axis if the angular orientation is within a first angular range, and the touch gesture may relate to a y-axis, if the angular orientation of a touch gesture is within another angular range. For example, the angular orientation may be analyzed with respect to a predetermined line, for example a horizontal or vertical line.

In a possible embodiment, the determined range may be smaller than a range of the waveform currently displayed on the touch-screen.

For example, the position of the touch gestures on the touch-screen and/or the direction of movement of the touch gestures may define a range of the displayed waveform. In particular, by entering the multi-digit touch gesture on the touch-screen, a user may specify a part or segment of the displayed waveform, and this part may characterize the range of the measurement signal, which is used as a basis for the further processing. For example, the measurement signal relating to the limited range may be used for one or more subsequent processing operations.

In a possible embodiment, the first touch gesture and/or the second touch gesture may comprise a horizontal line, a vertical line or a dot. Furthermore, the first and/or the second touch gesture may also comprise any other kind of gesture, in particular gestures, which may be appropriate for characterizing a desired range of the displayed waveform in association with one or more desired operations. For example, the touch gesture may comprise a circle, a circular segment, a polygon or an open polygon line.

In a possible embodiment, the first touch gesture and the second touch gesture may relate to almost parallel lines.

For example, the first touch gesture and the second touch gesture may relate to two parallel lines, whereby the two parallel lines may be almost parallel to a horizontal or vertical line. In this way, by the two parallel lines, it is possible to specify and characterize appropriate limits, in particular limits to the x- or y-axis.

In a possible embodiment, the measurement apparatus comprises a configuration device. The configuration device may be adapted to configure a predetermined signal processing, in particular a predetermined signal processing associated to a specific multi-digit touch gesture.

For example, it may be possible to specify specific multi-digit touch gestures and define a desired signal processing, which is associated to the specific multi-digit gesture. In this way, a user may be in the position to define individual multi-digit gestures for one or more desired signal processing operations. Thus, the control of the measurement apparatus by multi-digit gestures can be adapted dynamically.

In a possible embodiment, the determined operation may comprise displaying context menu. In particular, the displayed context menu may provide multiple options.

By providing a context menu, in particular a context menu providing multiple options, a flexible control of the operations for the measurement apparatus can be achieved. In particular, the context menu may provide multiple options depending on the related measurement operation. In this way, the context menu may be dynamically and/or automatically adapted. Furthermore, the context menu may provide different options depending on the type of the detected multi-digit gesture.

In a possible embodiment, the measurement signal processing device is adapted to perform at least one of the following operations: Identifying a characteristic parameter in the determined range, in particular identifying a minimum and/or maximum value, zooming the determined range, determining a rising or falling time, or determining a duty cycle. However, it is understood, that any other operation may be also performed based on a related multi-digit gesture.

In a possible embodiment, the touch-screen may be adapted to display a track of the received multi-digit gesture. For example, the touch-screen may display a line illustrating the movement of a finger tip of each gesture related to the multi-digit gesture. In this way, a user can easily recognize the entered multi-digit touch gesture. In this way, the analysis of the displayed waveform can further improved.

In a possible embodiment, the touch-screen is adapted to display an indication associated to the determined operation and/or the determined range.

For example, the touch-screen may provide an indication by alphanumeric elements, for example a text element or a number or by displaying an appropriate icon related to the determined operation based on the multi-digit touch gesture. Accordingly, the touch-screen may display alphanumeric elements, for example numbers or characters related to the determined range. Furthermore, the determined range may be also displayed in any other appropriate manner, for example by changing the color of the background in the determined range on the touch-screen displaying the waveform.

With the present invention it is therefore now possible to control the operation of a measurement device such as an oscilloscope or the like by simply entering multi-digit touch gestures. Accordingly, a user can easily control the operation of the measurement device without a need of going through multiple menus, in particular through multiple hierarchically arranged menus. In this way, the consumption of time for controlling the measurement device during a measurement process can be reduced and failures due to inappropriate instructions can be minimized. Thus, the measurement process can be simplified and the reliability of the measurement results can be improved.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures of the drawings, in which.

Figure 1:
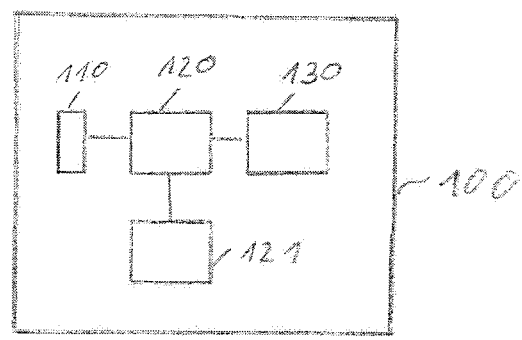
FIG. 1: shows a block diagram of a measurement apparatus according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same or similar reference signs in each case, unless stated otherwise.

DETAILED DESCRIPTION OF THE DRAWINGS

FIG. 1 shows a block diagram of an embodiment of a measurement apparatus 100. The measurement apparatus 100 comprises an input port 110, a measurement signal processing device 120 and a touch-screen 130. The input port 110 may be connected to a measuring point. For example, a measurement signal may be measured by a probe (not shown) and the measured signal may be forwarded from the probe to the input port 110 via a cable. However, it is understood that any other kind for acquiring a measurement signal and providing the measurement signal to the input port 110 may be also possible. The measured signal may be provided to the input port 110 in an analogue form. The analogue measurement signal may be converted to digital data by an analogue to digital converter. For example, the analogue to digital converter may be located in the input port 110. Accordingly, digital data related to the analogue to digital converted measurement signal may be provided to measurement signal processing device 120. Alternatively, it may be also possible to forward the measurement signal to the measurement signal processing device 120 in an analogue form and to perform the analogue to digital conversion by the measurement signal processing device 120. Furthermore, a separate analogue to digital converter may be arranged in a signal path between the input port 110 and the measurement signal processing device 120. Furthermore, a filtering, amplification or attenuation of the measurement signal may be also applied to the received measurement signal.

The measurement signal processing device 120 may receive the measurement signal from the input port 110 or the digital data related to the received measurement signal. In particular, the measurement signal processing device 120 may sample the digital data related to the measurement signal and store the digital data related to the measurement signal in a memory 121. Furthermore, measurement signal processing device 120 may provide the data related to the measurement signal to touch-screen 130 for displaying a waveform of the measurement signal on the touch-screen 130. Accordingly, a waveform of the received measurement signal is provided to a user on the touch-screen 130.

After displaying the waveform of the measurement signal on the touch-screen 130, a user may enter a multi-digit touch gesture on the touch-screen 130. The multi-digit touch gesture may comprise at least two touch gestures: a first touch gesture and a second touch gesture. The touch-screen 130 may receive the multi-digit touch gesture and provide information regarding the received multi-digit touch gesture to the measurement signal processing device 120.

Measurement signal processing device 120 may receive the information about the entered multi-digit touch gesture and determine a range and a specific operation based on the entered multi-digit touch gesture. In this connection, it is important to note that both, the range and the operation are determined based on the same multi-digit touch gesture at once. This will be described in more detail below.

After determining the range and the operation, the measurement signal processing device 120 may perform a processing of the measurement signal based on the determined range and the determined operation. The result of this processing may be output on the touch-screen 130.

Each touch gesture of the multi-digit touch gesture may relate to an individual touch on the touch-screen, possible in combination with a movement on the touch-screen after touching the touch-screen. Accordingly, a multi-digit touch gesture may comprise at least two touch gestures, each relating to a separate touch on the touch-screen.

In a possible embodiment, the individual touch gestures of the multi-digit touch gesture may be entered simultaneously. In this case, multiple fingers may be used, and each finger touches the touch-screen almost at the same point in time. For example, multiple fingers of a same hand may be used for simultaneously touching the touch-screen 130. However, it may be also possible to use fingers from two different hands, for example a left hand and a right hand of a user, for entering multiple touch gestures simultaneously.

Alternatively, it may be also possible to enter multiple touch gestures for a multi-digit touch gesture subsequently. For example, a second touch gesture may be entered on the touch-screen 130 after entering the first touch gesture has been finished. In such a case, the individual touch gestures may be entered by a same finger of a user. However, it may be also possible to use different fingers when entering multiple touch gestures subsequently. After subsequently entering multiple touch gestures, the individual touch gestures may be combined to a multi-digit touch gesture for further processing.

The individual touch gestures may relate, for example to a single tip of a finger on the touch-screen, which may be considered, for example as a point. Furthermore, a touch gesture may also relate to a line having a specific length. In particular, it may be possible to take into account the length of the touch gesture when analyzing the touch gesture. For example, different operations may be assigned to a touch gesture depending on the length of the touch gesture.

When entering multiple touch gestures relating to a same multi-digit touch gesture, the direction of movement of the individual touch gestures may be parallel, at least almost parallel. In particular, the direction of movement of the individual touch gestures may be parallel to a horizontal or vertical line (or at least a virtual horizontal or vertical line) of the touch display 130. Accordingly, depending on the direction of movement, the touch gestures may relate to an x-axis or y-axis. For example, touch gestures, which are almost parallel to a horizontal line may relate to an x-axis, and touch gestures, which are almost parallel to a vertical line relate to a y-axis.

However, any other appropriate touch gesture may be also possible. For example, touch gestures may be also specify circles, a segment of a circle, a rectangle or any other polygon or polygon line.

The analysis of the multi-digit touch gestures may be performed based on specific predetermined rules. However, it may be also possible to specify touch gestures, in particular multi-digit touch gestures and assign specific operations to individually define touch gestures. In this way, user specific touch gestures and/or operations may be defined in a very flexible manner.

In the following, some examples of touch gestures and relates operations are described.

Figure 2:
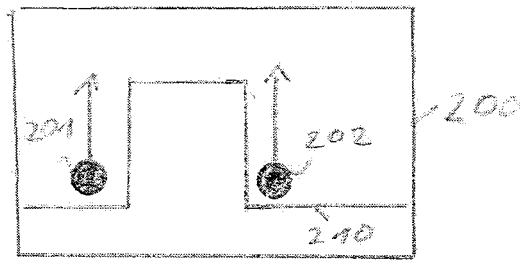
FIGS. 2 to 4: shows schematic diagrams of content of a touch-screen according to embodiments.

FIG. 2 shows a schematic illustration of content 200 on a touch-screen. For example, a signal waveform 210 may be displayed. Even though a rectangular pulse is shown in this illustration, the present invention is not limited to such waveform. Moreover, any other kind of waveform may be also displayed.

After displaying the waveform 210, a user may enter a multi-digit touch gesture comprising a first touch gesture 201 and a second touch gesture 202. In this example, the two touch gestures 201, 210 relate to a vertical movement of a finger on the touch-screen. In particular, the two tracks of touch gestures 201, 202 are almost parallel and the movement is in a vertical direction.

Accordingly, measurement signal processing device 120 may determine a range by a distance between the first touch gesture 201 and the second touch gesture 202. In response to this, the respective section of the waveform 210 may be highlighted. For example, a background of the identified range may have a color, which is different from the background of the remaining sections. Alternatively, lines may be displayed. However, any other appropriate scheme for illustrating the selected range may be possible, too.

Furthermore, measurement signal processing device 120 may analyze the first touch gesture 201 and the second touch gesture 202 of the multi-digit touch gesture in order to identify a related operation. For example, moving the finger upwards on the touch-screen may indicate a search for a maximum in the related range. Accordingly, measurement signal processing device 120 may automatically search for the maximum of the measurement signal in the specified range and provide the perspective data on the display. For example, the position of the maximum may be indicated by a pointer and/or the related value may be displayed on the touch-screen 130. However, any other appropriate scheme may be also possible.

Furthermore, a touch gesture may also relate to a search for a minimum or any other characteristic parameter, for example identifying a rising or falling time, a determination of a duty cycle, determining an uptime of a signal etc.

Figure 3:
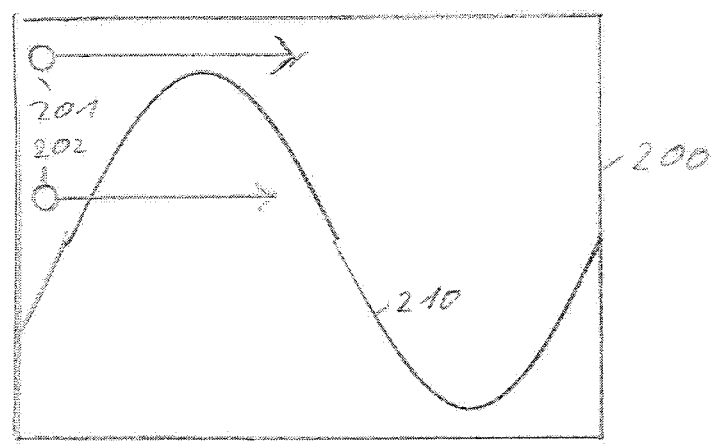

FIG. 3 shows a further example of content 200 in association with a touch gesture on the touch-screen 130. As can be seen in this example, the touch gesture comprises a first touch gesture 201 and a second touch gesture 202, which relate to a horizontal movement. Accordingly, such a touch gesture may specify a range of a y-axis. As already mentioned in connection with FIG. 2, a specific operation may be applied to the measurement signal in the specified range according to the multi-digit touch gesture. For example, it may be searched for a time interval, in which the measurement signal is within the specified range. However, any other appropriate operation may also be associated with horizontal touch gestures.

Figure 4:
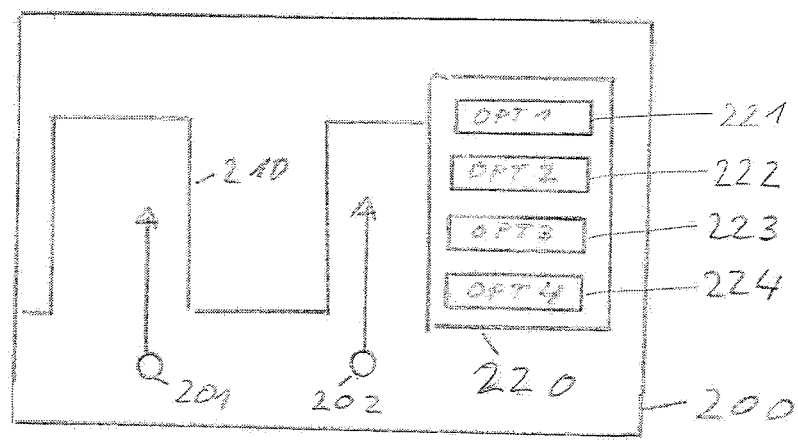

FIG. 4 shows a further example of content 200 on a touch display 130 according to an embodiment. As can be seen in this example, a multi-digit touch gesture may be also assigned with opening a context menu 220. For example, context menu 220 may provide multiple options 221-224 for further operations. In particular, the provided options 221-224 may be options, which are assigned to a specific multi-digit touch gesture. In other words, the options 221-224 in the context menu 220 may vary depending on the detected multi-digit touch gesture. For example, first options may be provided when detecting an upward moving of a touch gesture 201 or 202. Second options may be provided when detecting a downward moving of the touch gestures 201 and 210. It may be even possible to provide still further options when detecting a opposed moving of the first touch gesture 201 and the second touch gesture 202. However, it is understood that any other scheme for selecting appropriate options in the context menu depending on the detected touch gestures may be also possible. In any case, a user may select one of the provided options by a further touch on the displayed context menu.

Furthermore, a user may be assisted by entering the touch gestures by displaying a track of the movement during entering the touch gestures 201 and 202. For example, a line may be displayed on the touch-screen 130 for illustrating the track of movement during entering the touch gestures.

Figure 5:
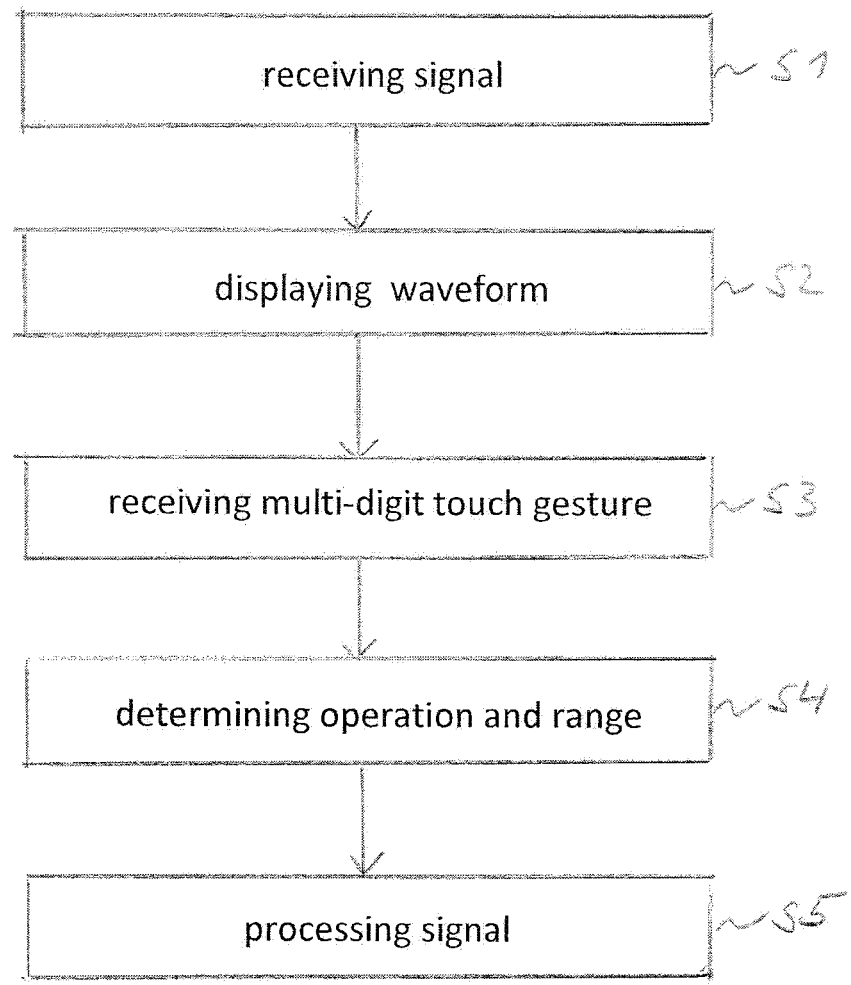
FIG. 5: shows a flow diagram of a method for analyzing a measurement signal according to an embodiment.

FIG. 5 shows a flow diagram of a method for analyzing a measurement signal according to an embodiment. The method comprises a step S1 of receiving a measurement signal. In particular, the measurement signal may be received by an input port 110. The method further comprises a step S2 of displaying a waveform of the received measurement signal. The waveform of the received measurement signal may be displayed on a touch-screen 130. In a step S3, a multi-digit touch gesture is received. The multi-digit touch gesture comprises at least a first touch gesture 201 and a second touch gesture 201. In step S4, an operation and a range of the measurement signal is determined based on the received multi-digit touch gesture. In step S5, the measurement signal is processed based on the determined operation and the determined range.

Summarizing, the present invention relates to an enhanced control of a measurement device displaying a signal waveform of a measurement signal. For this purpose, the waveform of the measurement signal is displayed on a touch-screen. The touch-screen receives multi-digit touch gestures comprising at least two touch gestures. The touch gestures of the multi-digit touch gesture are analyzed in order to determine simultaneously an operation and a range of the measurement signal on which the determined operation has to be applied. In this way, the control of the measurement device can be simplified.

The invention claimed is:

1. A measurement apparatus for analyzing a measurement signal, wherein the measurement apparatus includes an oscilloscope comprising:
    an input port, adapted to receive a measurement signal;
    a touch-screen, adapted to display a waveform of the received measurement signal and to receive a multi-digit touch gesture, the multi-digit touch gesture comprising at least a first touch gesture and a second touch gesture,
    wherein the first touch gesture and the second touch gesture relate to lines which are parallel to an x-axis or y-axis of the touch-screen; and
    a measurement signal processing device, adapted to determine an operation and a range of the measurement signal based on the received multi-digit touch gesture, and to perform a processing of the measurement signal based on the determined operation and the determined range,
    wherein the measurement signal processing device is configured to identify a characteristic parameter in the determined range according to said received multi-digit touch gesture, and to determine said operation and range of the measurement signal based on the identified characteristic parameter.

2. The measurement apparatus of claim 1, wherein the touch-screen is adapted to simultaneously receive the first touch gesture and the second touch gesture.

3. The measurement apparatus of claim 1, wherein the touch-screen is adapted to receive the first touch gesture and the second touch gesture subsequently.

4. The measurement apparatus of claim 1, wherein the measurement signal processing device is adapted to determine whether the determined range relates either to an x-axis or a y-axis.

5. The measurement apparatus of claim 1, wherein the determined range is smaller than the range of the waveform currently displayed on the touch-screen.

6. The measurement apparatus of claim 1, comprising a configuration device, adapted to specify a predetermined signal processing for a specific multi-digit gesture.

7. The measurement apparatus of claim 1, wherein the determined operation comprises displaying a context menu providing multiple options.

8. The measurement apparatus of claim 1, wherein the measurement signal processing device is configured to perform at least one of zooming the waveform to the determined range, determining a rising or falling time or determining a duty cycle.

9. The measurement apparatus of claim 8, wherein the signal processing device is configured to perform identifying a minimum or a maximum value.

10. The measurement apparatus of claim 1, wherein the touch-screen is adapted to display a track of the received multi-digit touch gesture on the touch-screen.

11. The measurement apparatus of claim 1, wherein the touch-screen is adapted to display an indication associated to the determined operation or the determined range.

12. A method for analyzing a measurement signal by an oscilloscope, the method comprising the steps of:
    receiving a measurement signal;
    displaying a waveform of the received measurement signal on a touch-screen;
    receiving a multi-digit touch gesture, the multi-digit touch gesture comprising at least a first touch gesture and a second touch gesture, wherein the first touch gesture and the second touch gesture relate to lines which are parallel to an x-axis or y-axis of the touch-screen;
    determining an operation and a range of the measurement signal based on the received multi-digit touch gesture; and
    processing of the measurement signal based on the determined operation and the determined range, wherein the processing comprises identify a characteristic parameter in the determined range according to said received multi-digit touch gesture,
    wherein said operation and range of the measurement signal are determined based on the identified characteristic parameter.

13. An oscilloscope, comprising:
    an input port, adapted to receive a measurement signal;
    a touch-screen, adapted to display a waveform of the received measurement signal and to receive a multi-digit touch gesture, the multi-digit touch gesture comprising at least a first touch gesture and a second touch gesture, wherein the first touch gesture and the second touch gesture relate to lines which are parallel an x-axis or y-axis of the touch-screen; and a measurement signal processing device, adapted to determine an operation and a range of the measurement signal based on the received multi-digit touch gesture, and to perform a processing of the measurement signal based on the determined operation and the determined range, wherein the measurement signal processing device is configured to identify a characteristic parameter in the determined range according to said received multi-digit touch gesture, and to determine said operation and range of the measurement signal based on the identified characteristic parameter.

* * * * *